United States Patent
Patane' et al.

(10) Patent No.: US 11,469,177 B2
(45) Date of Patent: *Oct. 11, 2022

(54) ELECTRONIC DEVICE WITH SHORT CIRCUIT PROTECTION ELEMENT, FABRICATION METHOD AND DESIGN METHOD

(71) Applicant: STMICROELECTRONICS S.r.l., Agrate Brianza (IT)

(72) Inventors: Francesco Patane', Pedara (IT); Alfio Russo, Biancavilla (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,312

(22) Filed: Sep. 29, 2020

(65) Prior Publication Data
US 2021/0013147 A1 Jan. 14, 2021

Related U.S. Application Data

(63) Continuation of application No. 16/389,866, filed on Apr. 19, 2019, now Pat. No. 10,818,593.

(30) Foreign Application Priority Data

Apr. 20, 2018 (IT) .................. 102018000004752

(51) Int. Cl.
*H01L 23/525* (2006.01)
*H01H 85/02* (2006.01)
(Continued)

(52) U.S. Cl.
CPC ..... *H01L 23/5256* (2013.01); *H01H 85/0241* (2013.01); *H01L 23/62* (2013.01);
(Continued)

(58) Field of Classification Search
CPC ................. H01L 23/5256; H01L 27/0292
See application file for complete search history.

(56) References Cited

U.S. PATENT DOCUMENTS 5,736,779 A * 4/1998 Kobayashi .......... H01L 29/7811
257/357
10,818,593 B2 * 10/2020 Patané ................ H01L 27/0288
(Continued)

FOREIGN PATENT DOCUMENTS

WO 2014/204491 12/2014

OTHER PUBLICATIONS

Venkatraman, Prasad et al., "Large Area MOS-Gated Power Devices Using Fusible Link Technology," IEEE Transactions on Electron Devices, 43(2):347-351, Feb. 1996.

*Primary Examiner* — Farun Lu
(74) *Attorney, Agent, or Firm* — Seed IP Law Group LLP

(57) ABSTRACT

An electronic device includes: a control terminal, which extends on a first face of a substrate; a first conduction terminal, which extends in the substrate at the first face of the substrate; a first insulating layer interposed between the control terminal and the first conduction terminal; a conductive path, which can be biased at a biasing voltage; and a protection element, coupled to the control terminal and to the conductive path, which forms an electrical connection between the control terminal and the conductive path and is designed to melt, and thus interrupt electrical connection, in the presence of a leakage current higher than a critical threshold between the control terminal and the first conduction terminal through the first insulating layer.

20 Claims, 5 Drawing Sheets

(51) Int. Cl.
  *H02H 3/02*    (2006.01)
  *H01L 29/78*   (2006.01)
  *H01L 29/16*   (2006.01)
  *H01L 23/62*   (2006.01)
  *H01L 27/02*   (2006.01)

(52) U.S. Cl.
  CPC ...... *H01L 27/0292* (2013.01); *H01L 29/1608* (2013.01); *H01L 29/7803* (2013.01); *H01L 29/7815* (2013.01); *H02H 3/023* (2013.01); *H01H 2085/0283* (2013.01)

(56) References Cited

U.S. PATENT DOCUMENTS

| | | |
|---|---|---|
| 2010/0163888 A1 | 7/2010 | Saggio et al. |
| 2013/0001696 A1* | 1/2013 | Akiyama ............ H01L 27/0255 |
| | | 438/237 |
| 2013/0069082 A1 | 3/2013 | Okada et al. |
| 2020/0043787 A1* | 2/2020 | Su ..................... H01L 23/535 |
| 2020/0083215 A1 | 3/2020 | Ichijo et al. |

\* cited by examiner

ELECTRONIC DEVICE WITH SHORT CIRCUIT PROTECTION ELEMENT, FABRICATION METHOD AND DESIGN METHOD

BACKGROUND

Technical Field

The present disclosure relates to an electronic device, in particular a power MOSFET, provided with a protection element, to a fabrication method for the electronic device, and to a method for designing the electronic device. In particular, the protection element is a fuse.

Description of the Related Art

Numerous scientific works have reported good switching performances for MOSFET devices made of silicon carbide (SiC). From an industrial standpoint, in addition to the switching performances, SiC devices further have a good structural strength, which is a desirable characteristic in power systems.

During the fabrication steps and handling of SiC wafers, the interaction between the machinery and the SiC wafers may cause the release of debris, on account of the high hardness of SiC. Hence, this debris may permanently deposit on the surface of the wafers and form local defects, which may adversely affect the functionality of the final MOSFET device.

In this connection, FIG. 1A illustrates, in lateral sectional view, a transistor 1, in particular a vertical-channel MOSFET, comprising: a SiC substrate 8; a gate region 4, made, for example, of polysilicon, arranged on a first surface of the substrate 8; a body region 5, which extends in the substrate 8 at the first surface; a source region 6, which extends in the body region 5 at the first surface of the substrate 8; and a drain region 7, which extends on a second surface of the substrate 8, opposite to the first surface.

The transistor 1 has a particle 2 of debris interposed between the gate region 4 and the source region 6. Moreover, a gate-oxide layer 10 extends, on the source region 6, between the substrate 8 and the gate region 4. In particular, the particle 2 extends through the gate-oxide layer 10 throughout the thickness of the latter, electrically connecting the source region 6 and the gate region 4 with each other. Consequently, the particle 2 constitutes a point defect that shorts the gate region 4 with the source region 6.

FIG. 1B is a circuit representation of the transistor 1 of FIG. 1A.

In use, when the gate region 4 is biased at a biasing voltage $V_{GS}$, the particle 2 forms a conductive electrical path that causes flow of a current $i_{SC}$ between the gate region 4 and the source region 6 (in what follows also referred to as "short circuit current"). In presence of this current $i_{SC}$, the transistor 1 fails.

A similar problem may arise in the case of imperfections that derive from the manufacturing process of the gate oxide, with consequent creation of leakage paths due to direct or tunnel connection between the gate region 4 and the source region 6.

Commercially available MOSFET devices are typically made up of a plurality of transistors 1 of the type shown in FIGS. 1A and 1B, which are connected in parallel with each other and co-operate with one another in order to appropriately manage the currents developed+6 by the specific application in which they are used. In the event of failure of even just one transistor 1, belonging to the MOSFET device, the entire MOSFET device must be discarded; this causes an increase in the fabrication costs.

BRIEF SUMMARY

According to the present disclosure, an electronic device provided with a protection element, a power MOSFET device including a plurality of said electronic devices, a fabrication method for the electronic device, and a method for designing the electronic device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1A:
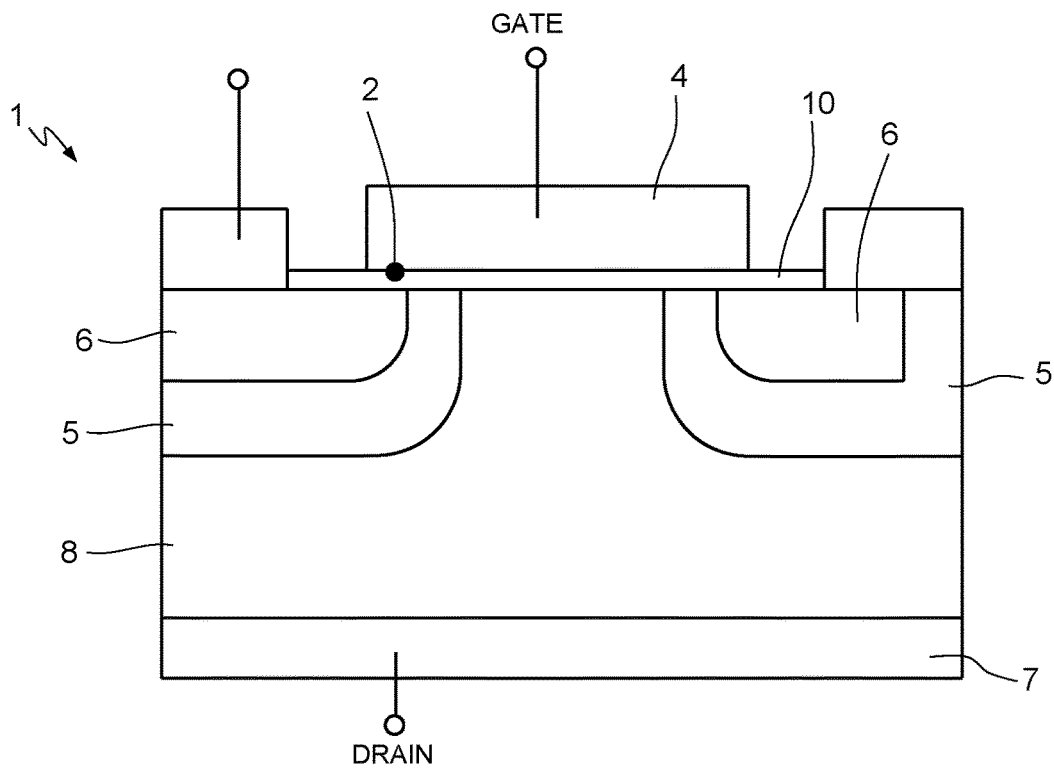
FIG. 1A shows, in cross-sectional view, a SiC MOSFET according to an embodiment of a known type having a defect through the gate oxide that causes a direct electrical connection between the gate terminal and the source terminal.
Figure 1B:
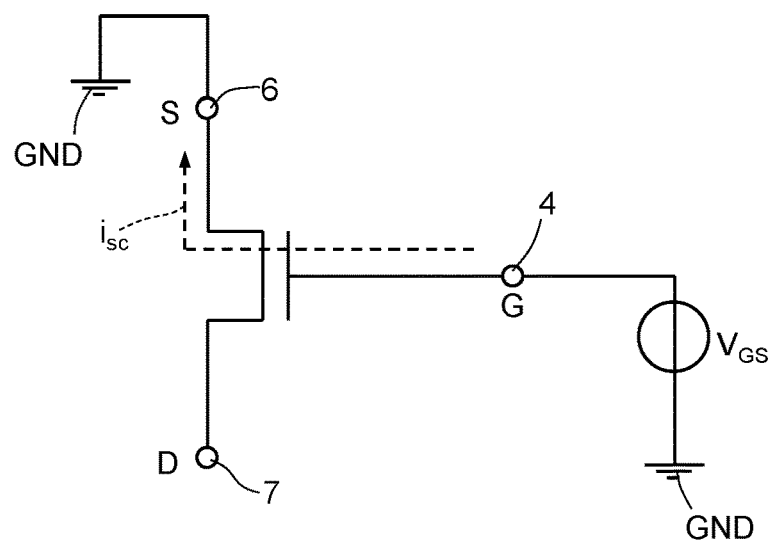
FIG. 1B shows a circuit diagram of the MOSFET of FIG. 1A.
Figure 2:
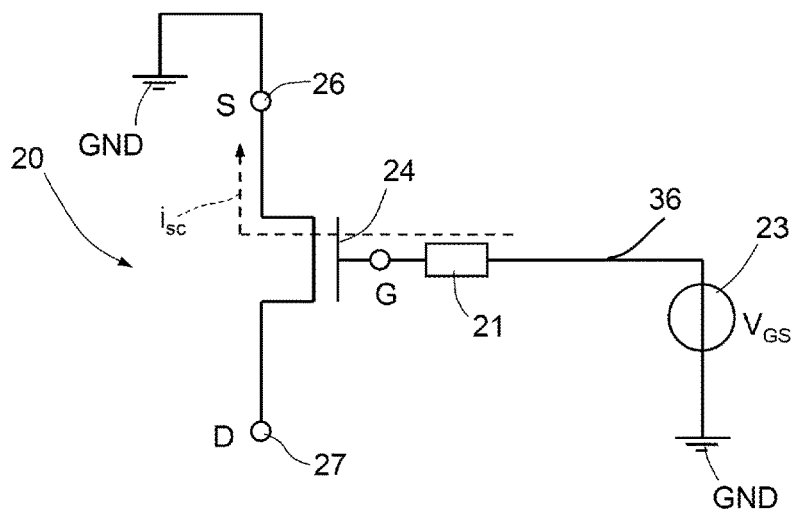
FIG. 2 shows a circuit diagram of a MOSFET provided with a protection element of a fuse type, according to an aspect of the present disclosure.

FIG. 2 illustrates an equivalent circuit of a transistor 20, in particular a vertical-channel MOSFET, even more in particular a power MOSFET, according to an aspect of the present disclosure. The transistor 20 comprises, in a way in itself known and as briefly described with reference to FIGS. 1A and 1B: a gate region 24 (which forms a control terminal G) that can be coupled, in use, to a generator 23 of a biasing voltage $V_{GS}$; a source region 26 (which forms a first conduction terminal S); and a drain region 27 (which forms a second conduction terminal D).

In particular, according to the present disclosure, the transistor includes a protection element 21 interposed between the gate region 24 and the generator 23. More in particular, the protection element 21 is a fuse configured to interrupt the electrical connection between the generator 23 and the gate region 24 in the presence of the short circuit current $i_{SC}$ (illustrated in FIG. 1B and described with reference to said figure), caused by the presence of the point defect represented for example in FIG. 1A, by the particle 2.

Figure 3:
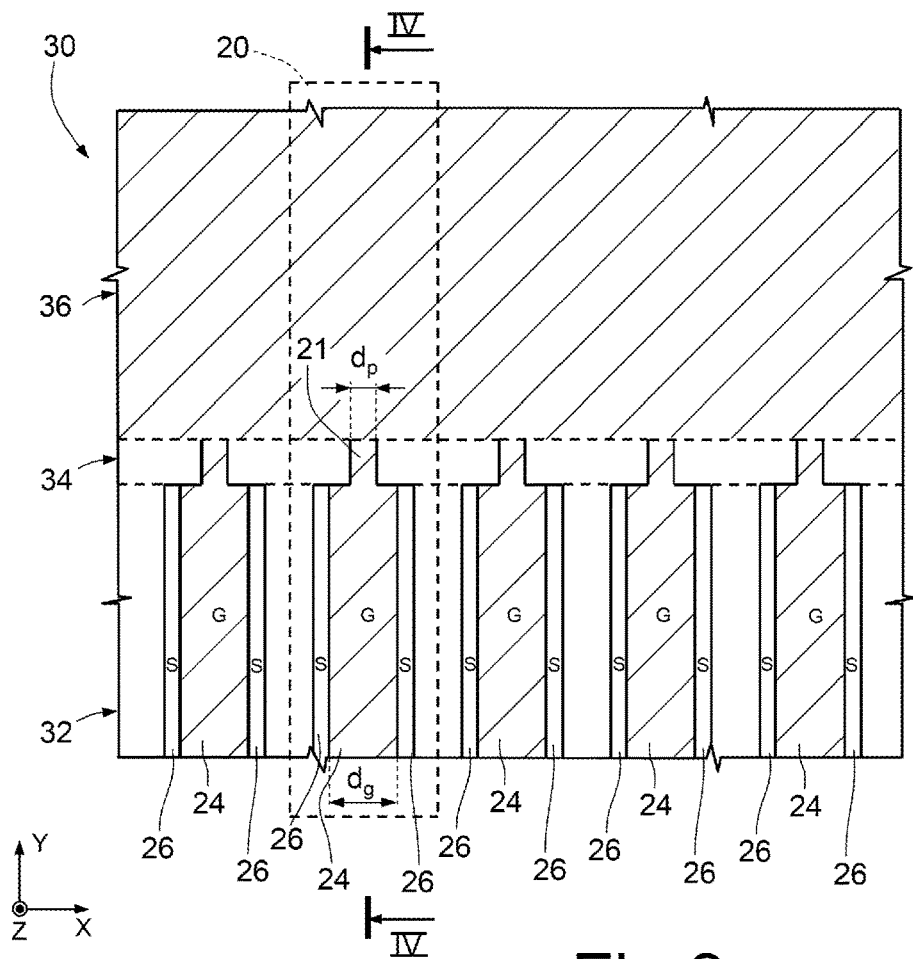
FIG. 3 shows, in top plan view, a layout of a portion of a MOSFET device including a plurality of MOSFETs of FIG. 2.

Shown in FIG. 3 is a MOSFET device 30 according to the present disclosure which is formed by a plurality (two or more) of transistors 20 of the type shown in FIG. 2, connected in parallel with each other. In the event of failure of one of the transistors 20 belonging to the MOSFET device 30, the respective fuse 21 blows, causing the interruption of the flow of short circuit current $i_{SC}$ between the generator 23 and the source region 26 through the gate region 24 and the point defect 2.

FIG. 3 shows, in a triaxial cartesian reference system X, Y, Z, a portion of the MOSFET device 30 according to one embodiment of the present disclosure; in particular, the MOSFET device 30 is shown in top plan view in the plane XY, and just the elements that are fundamental for an understanding of the present embodiment are shown.

The MOSFET device 30 comprises an active-area region 32, a protection region 34, and a connection region 36. The protection region 34 is interposed between the active-area region 32 and the connection region 36.

In detail, the active-area region 32 includes a plurality of gate regions 24 and a plurality of source regions 26, of a strip type, which extend each along a respective main direction, parallel to the axis Y, in a way in itself known. Each gate region 24, which is made, in particular, of polysilicon, has a width $d_G$, measured along the axis X, for example, comprised between 1 µm and 3 µm.

The protection region 34 includes a plurality of protection elements 21 (in particular, fuses), each of which is in electrical connection with a respective gate region 24. In particular, in the embodiment of FIG. 3, each fuse 21 is in structural and electrical continuity with the respective gate region 24. In other words, the fuse 21 and the respective gate region 24 form a monolithic structure. According to an aspect of the present disclosure, both the gate region 24 and the fuse 21 are made of polysilicon.

Each fuse 21 substantially has a parallelepipedal shape with a width $d_P$, measured along the axis X, smaller than the respective width $d_G$ of the gate region 24 to which it is coupled. The width $d_P$ is, for example, comprised between 1 µm and 3 µm.

The connection region 36 is made of conductive material, here polysilicon, is electrically coupled to each fuse 21, and is also configured to be electrically coupled to the generator 23 via a metallization, not shown in FIG. 3, and in a way in itself known.

In particular, in this embodiment, each fuse 21 is in structural and electrical continuity with the connection region 36. In other words, the connection region 36, the plurality of fuses 21, and the plurality of gate regions 24 form a monolithic structure.

Figure 4:
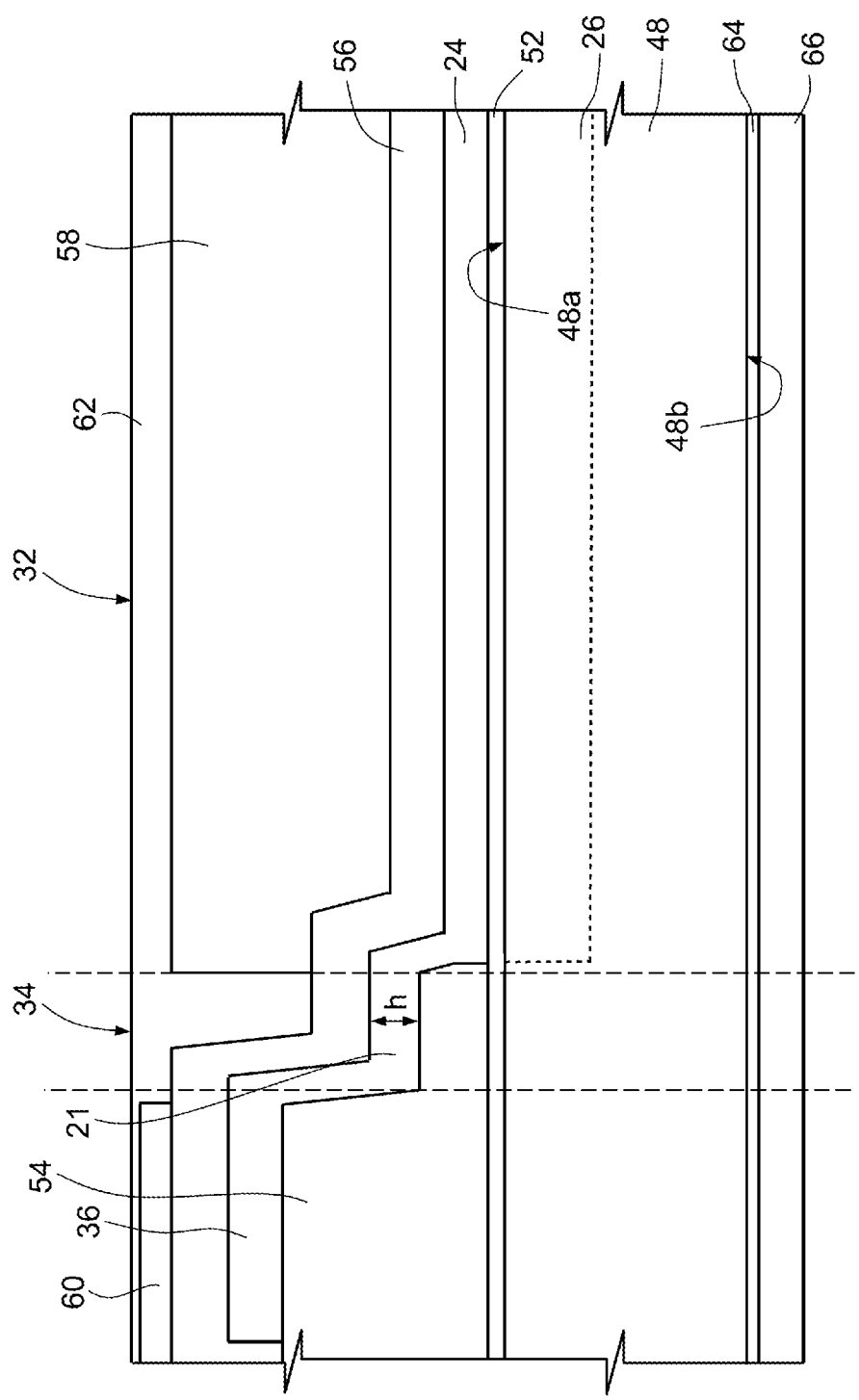
FIG. 4 is a lateral sectional view of the MOSFET device of FIG. 3, taken along the section line Iv-Iv of FIG. 3, according to one embodiment of the present disclosure.

FIG. 4 shows a cross-sectional view of the MOSFET device 30 of FIG. 3; in particular, FIG. 4 shows a portion of the transistor 20 of FIG. 3 taken along the section line IV-IV.

In detail, the transistor 20 comprises a substrate 48, in particular made of SiC, having a first face 48a and a second face 48b opposite to one another. In particular, in the present embodiment, with the term "substrate" it is envisaged a structural element that may comprise one or more epitaxial layers grown on a base substrate.

An insulating layer 52 (in particular, a gate oxide) extends over the first face 48a, for example made of deposited silicon oxide ($SiO_2$), with a thickness, measured along the axis Z, comprised between 300 Å and 600 Å.

The gate region 24 extends at the active-area region 32, on the insulating layer 52.

A field-plate-oxide layer 54, in particular made of TEOS, extends at the protection region 34 and to the connection region 36, on the insulating layer 52. The field-plate-oxide layer 54 has a thickness, measured along the axis Z, in a point corresponding to the protection region 34, comprised between 5000 Å and 15000 Å. The field-plate-oxide layer 54 has a thickness, measured along the axis Z, in a point corresponding to the connection region 36, comprised between 10000 Å and 20000 Å.

The fuse 21, of a thickness h, measured along the axis Z, comprised between 5000 Å and 15000 Å, extends at the protection region 34, on the field-plate-oxide layer 54. In other words, the fuse 21 has a cross section (i.e., the base area of the fuse 21), measured in the plane XZ, comprised between 0.5 µm² and 1.5 µm².

According to the present embodiment, the fuse 21 is in electrical and structural continuity with the gate region 24. Moreover, the fuse 21 is in electrical and structural continuity with the connection region 36.

A further insulating layer 56 extends on the gate region 24 and on the fuse 21, at the active region 32, the protection region 34, and the connection region 36. The further insulating layer 56 is, in particular, made of TEOS and has a thickness, measured along the axis Z, comprised between 5000 Å and 9000 Å.

A metallization layer 58, in particular made of Al/Si/Cu and having a thickness, measured along the axis Z, comprised between 2.5 µm and 3.5 µm, extends at the active region 32, on the further insulating layer 56. The metallization layer 58 forms the first conduction terminal S of the transistor 2 of FIG. 2.

A further metallization layer 60, in particular having a thickness, measured along the axis Z, comprised between 5000 Å and 9000 Å, extends at the connection region 36, on the further insulating layer 56. The further metallization layer 60 is a field-plate metallization.

A passivation layer 62, made, for example, of polyamide extends at the active region 32, the protection region 34, and the connection region 36, in particular on the metallization layer 58, on the further insulating layer 56, and on the further metallization layer 60, respectively.

An interface layer 64, made, in particular, of nickel silicide extends on the second face 48b. A metallization layer 66, made, for example, of Ti/Ni/Au extends on the interface layer 64. The metallization layer 66 forms the second conduction terminal D of the transistor 20 of FIG. 2.

In normal operating conditions, i.e., in the absence of defects of the type of FIG. 1A, there are no leakage currents between the gate region 24 and the source region 26, or in any case possible leakage currents are in the region of 10 nA (for gate biasing voltages $V_{GS}$ in the region of ±20 V), and are consequently negligible. Instead, in the presence of the aforementioned defects, a current (i.e., the short circuit current $i_{SC}$) of the order milliamps or slightly less (e.g., higher than 0.8 mA) may be present.

The Applicant has found that when, in use, the short circuit current $i_{SC}$, in particular of approximately 1 mA, flows through the fuse 21 for a time t of approximately 1 ms, a temperature variation ΔT of the order of $10^4$K develops, according to the following formula:

$$\Delta T = \frac{\rho i_{sc}^2 t}{cDh^2 d_P^2}$$

where ρ is the electrical resistivity of the fuse 21 (which, in the case of polysilicon, is $10^{-4}$ Ω·cm), c is the specific heat (which, in the case of polysilicon, is 700 J/kg·keV), D is the density of the material of the fuse 21 (which, in the case of polysilicon, is 2330 kg/m³), h is the thickness of the fuse 21 along the axis Z, and $d_P$ is the width of the fuse 21 along the axis X.

The Applicant has also found that such a temperature variation ΔT in the considered time interval causes the blowing of the fuse 21, with a consequent isolation of the transistor 20 from the generator 23 (FIG. 2).

The fuse 21 is designed so as to interrupt the electrical connection between the connection region 36 (connected in use to the generator 23) and the gate region 24 in the presence of the short circuit current $i_{SC}$ between the gate region 24 and the source region 26, the value of which depends upon the biasing voltage $V_{GS}$ and which is in each case higher than the leakage current that can be observed in normal operating conditions. In particular, the fuse 21 is designed so as to change its physical state (e.g., from solid to molten or from solid to gaseous) in the presence of the short circuit current $i_{SC}$.

Thus, in general, the fuse 21 is designed so as to interrupt the electrical connection between the connection region 36 and the gate region 24 (for example, by changing the physical state) in the presence of a current higher than a critical threshold that is at least one order of magnitude higher than the leakage current in normal operating conditions (e.g., a critical threshold equal to or higher than 50 nA).

Figure 5:
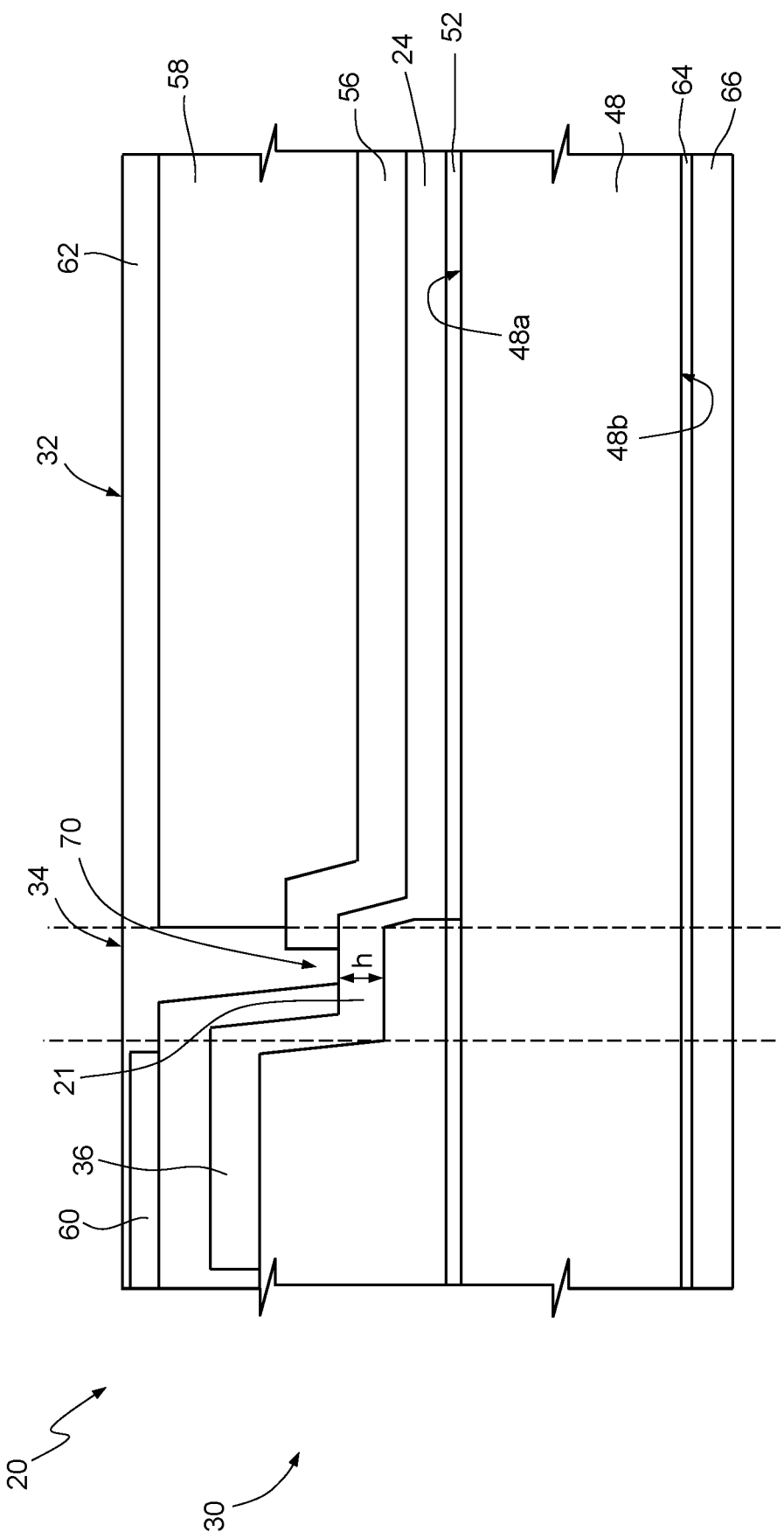
FIG. 5 is a lateral sectional view of the MOSFET device of FIG. 3, taken along the section line IV-IV of FIG. 3, according to a further embodiment of the present disclosure.

FIG. 5 shows a cross-sectional view, taken along the section line of an embodiment of the MOSFET device 30 of FIG. 3 alternative to the embodiment of the MOSFET device 30 of FIG. 4. In particular, elements corresponding to those shown in FIG. 4 are designated in FIG. 5 by the same reference numbers and will not be described any further.

In the embodiment of FIG. 5, each transistor 20 has, at the protection region 34, an opening 70 through the insulating layer 56, which reaches the fuse 21. The passivation layer 62 extends within the opening 70 so as to contact the fuse 21.

In the present embodiment, the passivation layer 62 allows to absorb and attenuate the products that derive from melting of the fuse 21 in a more effective way than the insulating layer 56, since the silicon oxide has an higher mechanical strength than that of polyamide.

Figure 6:
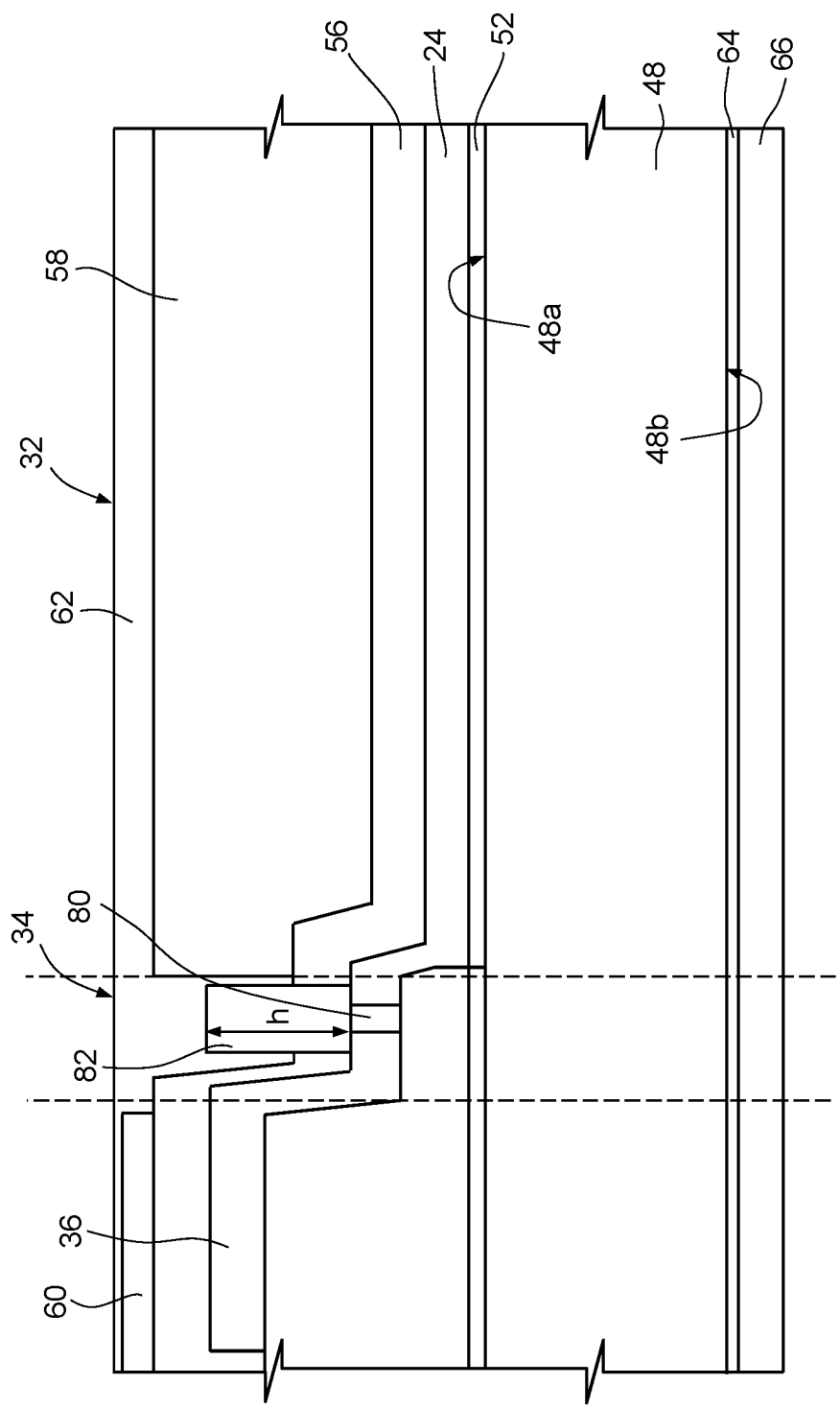
FIG. 6 is a lateral sectional view of the MOSFET device of FIG. 3, taken along the section line IV-IV of FIG. 3, according to yet a further embodiment of the present disclosure.

FIG. 6 shows a cross-sectional view, taken along the section line IV-IV, of an embodiment of the MOSFET device 30 of FIG. 3 alternative to the embodiments of the MOSFET device 30 of FIGS. 4 and 5. In particular, elements corresponding to those shown in FIGS. 4 and 5 are designated in FIG. 6 by the same reference numbers and will not be described any further.

In the embodiment of FIG. 6, the gate region 24 and the connection region 36 extend in part on the field-plate-oxide layer 54 at the protection region 34, without being in direct electrical contact therewith. More in particular, the respective portions of the gate region 24 and of the connection region 36 that extends at the protection region 34 are electrically insulated and physically separated from one another by an insulation element 80, made, for example, of $SiO_2$. In addition, the respective portions of the gate region 24 and of the connection region 36 that extends at the protection region 34 are electrically coupled together by means of a conductive element 82, in particular made of metal (for example, Al/Si/Cu), which extends through the insulating layer 56 so as to contact electrically the respective portions of the gate region 24 and of the connection region 36 that extends at the protection region 34. The conductive element 82 is also covered by the passivation layer 62.

Said conductive element 82 forms the fuse 21 of FIG. 2. In one embodiment, the metal fuse 21 substantially has a parallelepipedal shape with a thickness h, measured along the axis Z, comprised between 2.5 μm and 3.5 μm and a width $d_P$, measured along the axis X, comprised between 2.5 μm and 3.5 μm.

From an examination of the characteristics of the device provided according to the present disclosure, the advantages that it affords are evident.

In particular, in a MOSFET device formed by a plurality of transistors, connected in parallel with each other and co-operating for appropriately managing the currents required by the specific application in which they are used, in the event of failure of even just one transistor belonging to the MOSFET device, functionality of the entire MOSFET device can be restored by disconnecting the single defective transistor, maintaining good characteristics of electrical insulation and having only a fractional loss in the current capacity of the device.

Moreover, in the case of degradation of the insulation between the gate terminal and the source terminal of one or more transistors of the MOSFET device as a result of a leakage current higher than 0.8 mA, in use, the fuse corresponding to said one or more degraded transistors would blow, thus segregating them automatically.

Finally, it is clear that modifications and variations may be made to what is described and illustrated herein, without thereby departing from the sphere of protection of the present disclosure.

For example, the present disclosure may be applied to devices with a substrate made of a material other than SiC, for instance, Si, GaN (gallium nitride), or glass.

In addition, the present disclosure finds application in devices other than MOSFETs, for example, in GaN power devices, LDMOS (Laterally Diffused MOS) transistors, VMOS (Vertical MOS) transistors, DMOS (Diffused MOS) transistors, CMOS (Complementary MOS) transistors, or other integrated devices provided with a control terminal and at least one conduction terminal.

Moreover, the device 30 may include one or more transistors of a horizontal-channel MOSFET type.

Furthermore, the device 30 may be formed by just one transistor 20. In this case, blowing of the fuse 21 interrupts operation of the entire device 30. This embodiment may be useful in the case where the device 30 is integrated in a complex electronic system and is not vital for operation of the electronic system (for example, in the presence of redundancy), but where failure of said device 30 could jeopardize operation of other elements of the electronic system.

In addition, in the embodiment of FIGS. 4 and 5, the fuse 21 may be made of a material different from the material of the gate region 24 and/or of the connection region 36, for example, metal or conductive polymer, with an electrical resistivity of less than 10 Ω·cm.

Moreover, the fuse 21 may have a geometrical shape different from the parallelepipedal shape, such as, for example, a cylindrical or generically polyhedral shape.

According to a further embodiment, the protection element 21 is configured to interrupt the electrical connection between the connection region 36 and the gate region 24 in the absence of a change of physical state, but as a result of failure (whether direct failure or failure mediated by the presence of a further element) of the protection element 21 in the presence of the short circuit current $i_{SC}$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate having a first face and a second face;
a control terminal on the first face of the substrate;
a first conduction terminal that extends in the substrate from the first face;
a first insulating layer between the control terminal and the first conduction terminal;
a conductive path; and
a protection element coupled between the control terminal and the conductive path, the protection element configured to interrupt a signal between the control terminal and the conductive path in response to a current between the control terminal and the first conduction terminal.

2. The device of claim 1 wherein the protection element is a fuse.

3. The device of claim 1 wherein the protection element is made of a material having an electrical resistivity of less than 10 Ω·cm, chosen from among one or more of polysilicon, metal, or conductive polymer.

4. The device of claim 1 wherein the protection element, the control terminal, and the conductive path are in a same conductive layer.

5. The device of claim 1, comprising:
a second insulating layer that extends on the control terminal, on the conductive path, and on the protection element, and covers the protection element completely; and
a passivation layer of a polymeric material that extends on the second insulating layer and has a mechanical resistance lower than a mechanical resistance of the second insulating layer.

6. The device of claim 5 wherein the second insulation layer includes an opening throughout a thickness of the second insulating layer at the protection element, and the passivation layer directly contacts the protection element through the opening.

7. The device of claim 1 wherein the control terminal and the conductive path are electrically coupled together exclusively by the protection element.

8. The device of claim 7 wherein the protection element is configured to interrupt the electrical coupling between the control terminal and the conductive path in response to the current has a value higher than 0.8 mA.

9. The device of claim 1 wherein the protection element has a shape with a cross sectional area in a range of 0.5 $\mu m^2$ and 1.5 $\mu m^2$, the shape chosen from among parallelepipedal, cylindrical, and polyhedral.

10. The device of claim 1, comprising a second conduction terminal that extends on the second face of the substrate.

11. The device of claim 10 wherein the control terminal is a gate terminal, the first conduction terminal is a source terminal, and the second conduction terminal is a drain terminal.

12. The device of claim 1 wherein the substrate is silicon carbide.

13. A power MOSFET device, comprising:
a substrate having a first surface and a second surface opposite to one another;
a gate structure over the first surface;
a first source or drain structure adjacent to the gate structure;
a connection terminal; and
a fuse structure electrically coupled between the gate structure and the connection terminal.

14. The power MOSFET device of claim 13 wherein the fuse structure is integral to the gate structure.

15. The power MOSFET device of claim 13 wherein the gate structure has a first dimension in a second direction on a first plane that is transverse to first direction, the fuse structure has a second dimension in the second direction, and the second dimension is smaller than the first dimension.

16. The power MOSFET device of claim 13, comprising a first dielectric layer over the fuse structure and the gate structure, the first dielectric layer including an opening that extends to the fuse structure.

17. The power MOSFET device of claim 16, comprising a second dielectric layer over the first dielectric layer with respect to the substrate, the second dielectric layer extending to the fuse structure through the opening in the first dielectric layer.

18. The power MOSFET device of claim 16, comprising a first metal layer contacting the fuse structure in the opening of the first dielectric layer.

19. A semiconductor structure, comprising:
a silicon carbide substrate; and
a conductive layer over the silicon carbide substrate, the conductive layer including:
a conductive path;
a plurality of gate strips that are separated from one another, each gate strip of the plurality of gate strips having a first dimension in a first direction on a first plane; and
a plurality of protection strips, each protection strip of the plurality of protection strips coupled between a respective gate strip of the plurality of gate strips and the conductive path in a second direction on the first plane, the second direction transverse to the first direction, and the each protection strip having a second dimension in the first direction that is smaller than the first dimension of the respective gate strip.

20. The semiconductor structure of claim 19 wherein, with respect to the silicon carbide substrate, the each protection strip elevates over the respective gate strip, and the conductive path elevates over the protection strip.

* * * * *